(12) United States Patent
Taylor et al.

(10) Patent No.: US 11,169,222 B2
(45) Date of Patent: Nov. 9, 2021

(54) ORTHOGONAL SQUID ARRAYS ON A BASELINE WITH ROTATION

(71) Applicant: The United States of America as represented by the Secretary of the Navy, San Diego, CA (US)

(72) Inventors: Benjamin Taylor, San Diego, CA (US); Thomas Sheffield, San Diego, CA (US); Daniel Hallman, San Diego, CA (US); Susan Anne Elizabeth Berggren, San Diego, CA (US); Anna Leese de Escobar, San Diego, CA (US)

(73) Assignee: United States of America as represented by the Secretary of the Navy, Washington, DC (US)

( * ) Notice: Subject to any disclaimer, the term of this patent is extended or adjusted under 35 U.S.C. 154(b) by 307 days.

(21) Appl. No.: 16/589,830

(22) Filed: Oct. 1, 2019

(65) Prior Publication Data

US 2021/0096193 A1    Apr. 1, 2021

(51) Int. Cl.
*G01R 33/00* (2006.01)
*G01R 33/035* (2006.01)
(Continued)

(52) U.S. Cl.
CPC ..... *G01R 33/0354* (2013.01); *G01R 33/0082* (2013.01); *G01R 33/0094* (2013.01);
(Continued)

(58) Field of Classification Search
CPC ............... G01R 33/00; G01R 33/0035; G01R 33/0023; G01R 33/0017; G01R 31/3191;
(Continued)

(56) References Cited

U.S. PATENT DOCUMENTS 9,991,968 B1 * 6/2018 Taylor ...................... G01S 3/46
10,078,118 B2   9/2018 Berggren et al.
(Continued)

OTHER PUBLICATIONS

Kornev et al., "Bi-SQUID: a novel linearization method for dc SQUID voltage response," Supercond. Sci. and Tech., 22, 114011 (2009).
(Continued)

*Primary Examiner* — Jermele M Hollington
*Assistant Examiner* — Taqi R Nasir
(74) *Attorney, Agent, or Firm* — Naval Information Warfare Center, Pacific; Kyle Eppele

(57) ABSTRACT

A system is provided for detecting a radio frequency signal. The system includes a dielectric platform, a first SQUID array, a second array of SQUIDs and a processing component. The dielectric platform has a first planar surface and a second planar surface that is disposed at an angle relative to the first planar surface. The first array of SQUIDs is disposed on the first planar surface and can output a first detection signal based on the radio frequency signal. The second array of SQUIDs is disposed on the second planar surface and can output a second detection signal based on the radio frequency signal. The processing component can determine a first plane from which the radio frequency signal is transmitting based on the first detection signal and the second detection signal.

20 Claims, 8 Drawing Sheets

(51) Int. Cl.
*G06F 9/38* (2018.01)
*G06N 10/00* (2019.01)

(52) U.S. Cl.
CPC ....... *G01R 33/0352* (2013.01); *G06F 9/3877* (2013.01); *G06N 10/00* (2019.01)

(58) Field of Classification Search
CPC ............. G01R 33/0358; G01R 33/0356; G01R 33/0354; G01R 33/0094; G01R 33/0352; G01B 7/004; G01C 17/38; G06F 3/017; G06F 3/0346; G06F 3/012; G06F 9/3877; H01L 39/223; G06N 10/00
See application file for complete search history.

(56) References Cited

U.S. PATENT DOCUMENTS

| | | | | |
|---|---|---|---|---|
| 2004/0232912 | A1* | 11/2004 | Tsukamoto | G01R 33/025 324/248 |
| 2017/0045592 | A1 | 2/2017 | Berggren et al. | |
| 2017/0146618 | A1* | 5/2017 | Leese de Escobar | G01R 33/0354 |
| 2019/0008408 | A1 | 1/2019 | Kjeldsen et al. | |
| 2019/0339339 | A1* | 11/2019 | Berggren | G01R 33/0358 |

OTHER PUBLICATIONS

Berggren et al., "Modeling the effects of fabrication spreads and noise on series coupled arrays of bi-squids," ISEC, 2013 IEEE 14th International, 1-3 (2013).
Longhini et al., "Voltage response of non-uniform arrays of bi-superconductive quantum interference devices," Journal of Applied Physics, 111, 093920 May 2012.
Prokopenko et al., "Dc and rf measurements of serial bi-squid arrays," IEEE Trans. on Appl. Supercond., 23, 1400607 (2013).
Kornev et al., "Active electrically small antenna based on superconducting quantum array," IEEE Trans. on Appl. Supercond., 23, 1800405 (2013).
Dalichaouch et al., "The effects of mutual inductances in two-dimensional arrays of Josephson junctions," Supercond. Sci. and Tech., 27, 065006 (2014).
Caputo et al., "Superconducting quantum interference filters as absolute magnetic field sensors," IEEE Trans. on Appl. Supercond., 15, 1044-1047 (2005).
S. Berggren, "Computational and mathematical modeling of coupled superconducting quantum interference devices," Ph.D. dissertation, San Diego State University (2012).
Berggren et al., "Simulated bi-SQUID Arrays Performing Direction Finding," SPAWAR Systems Center Pacific Technical Report #2089, 2015.

* cited by examiner

ORTHOGONAL SQUID ARRAYS ON A BASELINE WITH ROTATION

FEDERALLY-SPONSORED RESEARCH AND DEVELOPMENT

The United States Government has ownership rights in this invention. Licensing inquiries may be directed to Office of Research and Technical Applications, Naval Information Warfare Center, Pacific, Code 3600, San Diego, Calif., 92152; telephone (619)553-3001; email: ssc_pac_t2@navy.mil. Reference Navy Case No. 103,963.

BACKGROUND OF THE INVENTION

The present disclosure generally relates to systems and method for direction finding of signals in the high frequency (HF) to ultra-high frequency (UHF) range. Conventionally, when direction finding, at least two antennas are employed, wherein the distance between the two antennas is approximately one half a wavelength of the signal being detected. So for a signal having a wavelength on the order of 30-300 meters, the distance between the two antennas would need to be on the order of 15-150 meters. Because of this distance constraint, conventional direction finding systems cannot easily be deployed on smaller unmanned vehicles and drones.

A need exists for a direction finding system and method that is sufficiently compact so as to be deployed on unmanned vehicles and drones.

SUMMARY OF THE INVENTION

This disclosure teaches a system for detecting a radio frequency signal. The system includes a dielectric platform, a first array of superconducting quantum interference devices (SQUID array), a second SQUID array and a processing component. The dielectric platform has a first planar surface and a second planar surface that is disposed at an angle relative to the first planar surface. The first SQUID array is disposed on the first planar surface and can output a first detection signal based on the radio frequency signal. The second SQUID array is disposed on the second planar surface and can output a second detection signal based on the radio frequency signal. The processing component can determine a first plane from which the radio frequency signal is transmitting based on the first detection signal and the second detection signal.

This disclosure also teaches a system for detecting a radio frequency signal. The system includes a first dielectric platform, a first SQUID array, a second SQUID array, a third SQUID array, a fourth SQUID array, a second dielectric platform, a fifth SQUID array, a sixth SQUID array, a seventh SQUID array, an eighth SQUID array and a processing component. The first dielectric platform has a first planar surface, a second planar surface that is disposed at an angle relative to the first planar surface and third planar surface that is disposed at a second angle relative to the first planar surface and is dispose at a third angle relative to the second planar surface. The first SQUID array is disposed on the first planar surface, and is operable to output a first detection signal based on the radio frequency signal. The second SQUID array is disposed on the second planar surface and is operable to output a second detection signal based on the radio frequency signal. The third SQUID array is disposed on the first planar surface and is operable to output a third detection signal based on the radio frequency signal. The fourth SQUID array is disposed on the third planar surface and is operable to output a fourth detection signal based on the radio frequency signal.

The second dielectric platform is separated from the first dielectric platform by a distance and has a fourth planar surface, a fifth planar surface that is disposed at a fourth angle relative to the fourth planar surface and sixth planar surface that is disposed at a fifth angle relative to the fourth planar surface and is disposed at a sixth angle relative to the fifth planar surface. The fifth SQUID array is disposed on the fourth planar surface and is operable to output a fifth detection signal based on the radio frequency signal. The sixth SQUID array is disposed on the fifth planar surface and is operable to output a sixth detection signal based on the radio frequency signal. The seventh SQUID array is disposed on the fourth planar surface and is operable to output a seventh detection signal based on the radio frequency signal. The eighth SQUID array is disposed on the sixth planar surface and is operable to output an eighth detection signal based on the radio frequency signal. The processing component is operable to detect a vector from which the radio frequency signal is transmitting based on the first detection signal, the second detection signal, the third detection signal, the fourth detection signal, the fifth detection signal, the sixth detection signal, the seventh detection signal and the eighth detection signal.

BRIEF DESCRIPTION OF THE DRAWINGS

The accompanying drawings illustrate example embodiments and, together with the description, serve to explain the principles of the disclosure. A brief summary of the drawings follows.

DETAILED DESCRIPTION OF THE EMBODIMENTS

Superconducting Quantum Interference Devices (SQUIDs) are prior art and are comprised of tiny loops of superconducting material in which Josephson junctions are placed in the loop path. A Josephson junction is a region of material that provides a weak link between two fully superconducting regions. A DC SQUID is prior art and has two symmetrical Josephson junctions, which are able to sense extremely small magnetic fields. Non-uniform arrays of DC SQUIDs and DC bi-SQUIDs, which are DC SQUIDs with an additional Josephson junction bisecting the superconducting loop, are prior art and have been modeled in different array designs and coupling schemes to determine their linearity and sensing capacities and have been fabricated in low temperature superconducting materials.

A SQUID-based sensor detects minute magnetic fields and is decoupled from the size of the signal's wavelength. Hence the device can sense signals in a range from direct current (DC) to alternating current (AC) in the gigahertz range (the DC-GHz range), but still be contained fully on a 1×1 centimeter (cm) chip. Finding the direction of arrival of these signals is an important aspect of signal intelligence and is one function of a SQUID-based sensor in accordance with aspects of the present disclosure.

In one aspect of the present disclosure, a single rotating platform composed of two spatially separated and orthogonally oriented SQUID arrays may be used to determine the direction of arrival of a radio frequency (RF) signal in the HF to UHF range. Depending on the frequency of the signal, the measurements would be performed on a fractional to full wavelength baseline. The device could be packaged for use on multiple platform types with mission specific tasking.

The sensing portion of the device includes a cryogenically cooled thermally conductive low-dielectric material (e.g., sapphire, aluminum nitride, LiNbO3, etc.) integrated with two SQUID arrays on orthogonally cut faces. This will be described in greater detail with reference to FIGS. 1A-2B.

Figure 1A:
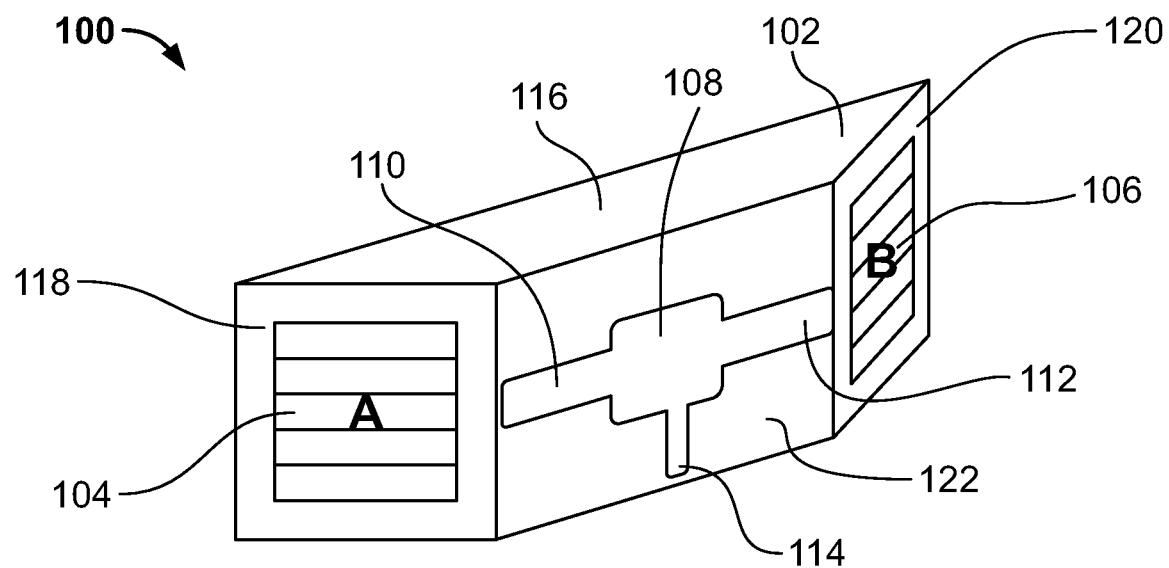
FIG. 1A illustrates a system, disposed in a first position, for detecting a radio frequency signal in accordance with aspects of the present disclosure.

FIG. 1A illustrates a system 100, disposed in a first position, for detecting a radio frequency signal in accordance with aspects of the present disclosure. As shown in the figure, system 100 includes a dielectric platform 102, SQUID array 104, SQUID array 106, a processing component 108, a communication line 110, a communication line 112 and an output line 114.

Dielectric platform 102 may be any cryogenically cooled thermally conductive low-dielectric material. In example embodiments, dielectric platform 102 may be made of a material selected from a group of materials consisting of sapphire, aluminum nitride, LiNbO3 and combinations thereof. Dielectric platform 102 supports SQUID array 104, SQUID array 106, processing component 108, communication line 110, communication line 112 and output line 114.

Dielectric platform 102 may take any shape that enables support of SQUID array 104 and SQUID array 106, such that SQUID array 104 is not parallel to SQUID array 106. In this example embodiment, dielectric platform 102 has a shape of a trapezoidal prism having a top trapezoidal surface 116, a rectangular planar surface 118, a rectangular planar surface 120 and a rectangular planar surface 122. Rectangular planar surface 118 is disposed such that, rectangular planar surface 118 is disposed on a first planar surface plane, and such that rectangular planar surface 120 is disposed on a second planar surface plane that is not parallel to rectangular planar surface 118. Rectangular planar surface 122 is disposed between rectangular planar surface 118 and rectangular planar surface 120, and contacts each of top trapezoidal surface 116, rectangular planar surface 118 and rectangular planar surface 120.

Rectangular planar surface 118 supports SQUID array 104, whereas rectangular planar surface 120 supports SQUID array 106. Rectangular planar surface 122 supports processing component 108, communication line 110, communication line 112 and output line 114.

Figure 1B:
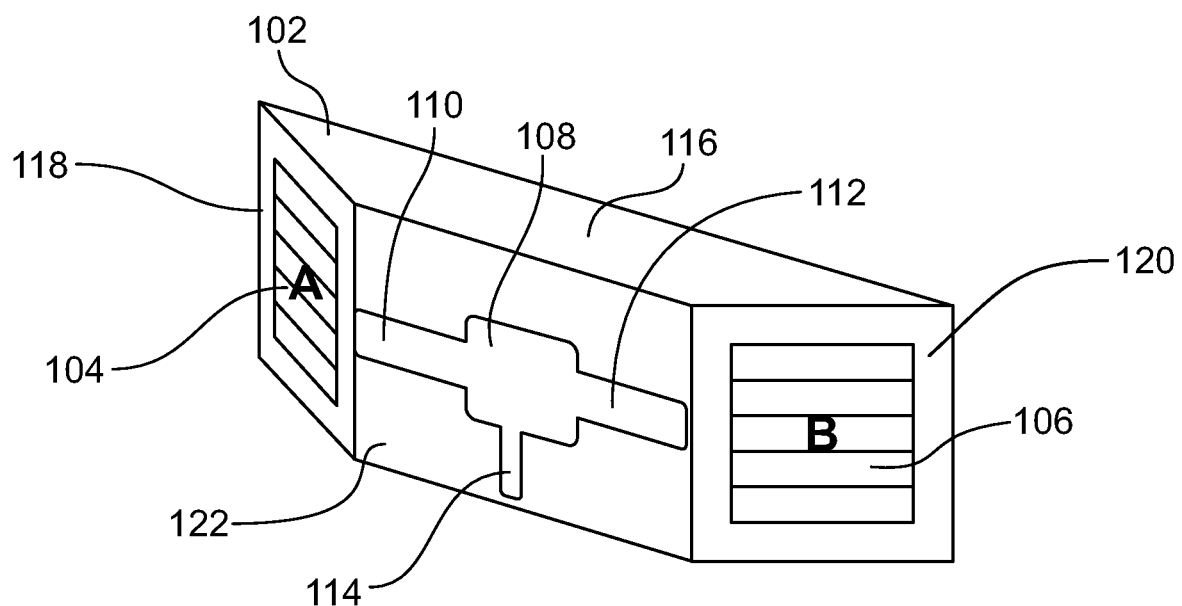
FIG. 1B illustrates the system of FIG. 1A, disposed in a second position.

FIG. 1B illustrates system 100, disposed in a second position, which is rotated ninety degrees (90°) from the first position of FIG. 1A.

System 100 may be used to detect the bearing of a received RF signal by detecting the signal at a first position, then rotating system 100 and detecting the signal at a second position. This will be described in greater detail with reference to FIGS. 2A-B.

Figure 2A:
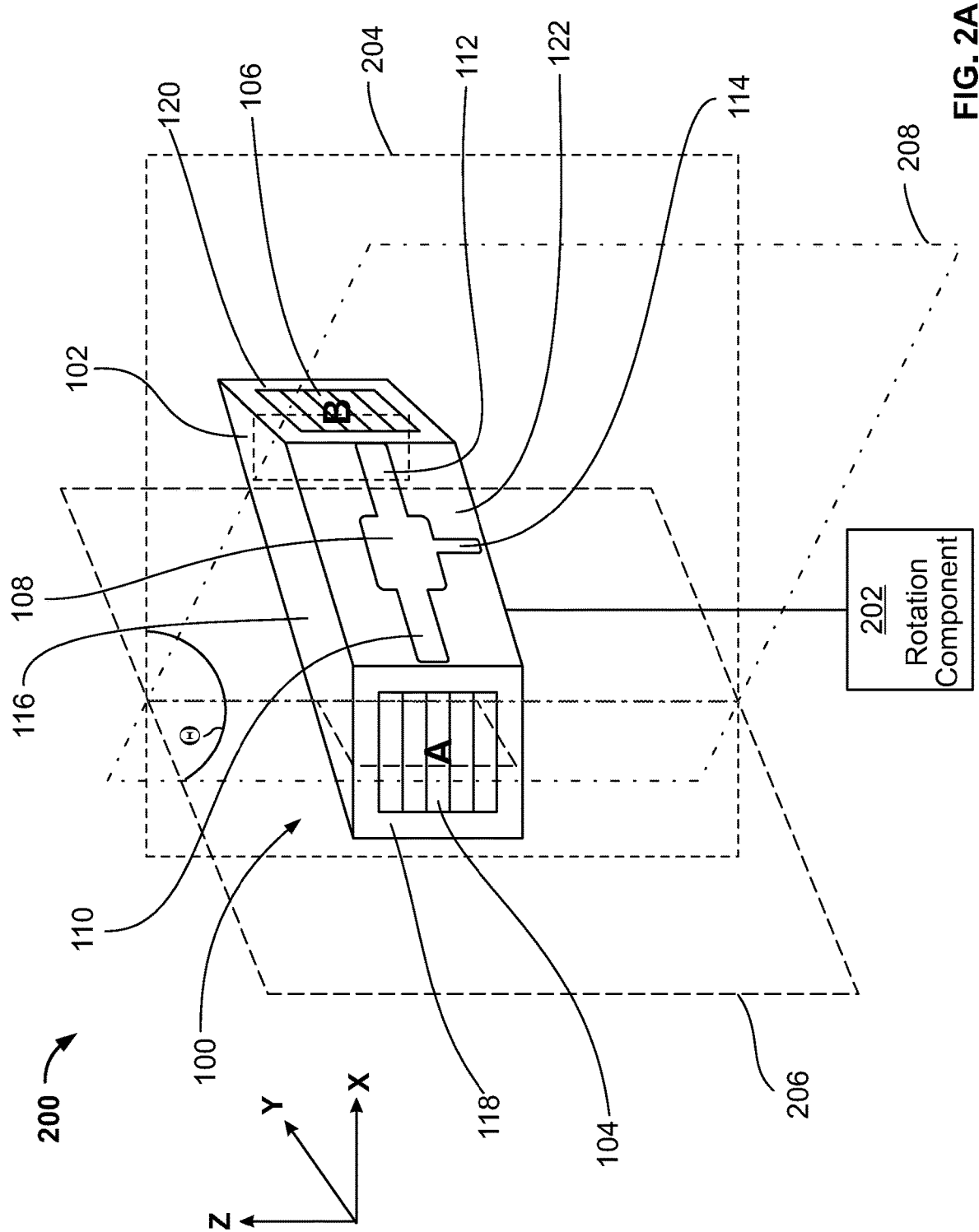
FIG. 2A illustrates a rotatable system, disposed in a first position, for detecting a radio frequency signal in accordance with aspects of the present disclosure.

FIG. 2A illustrates a rotatable system 200, with system 100 disposed in a first position, for detecting a radio frequency signal in accordance with aspects of the present disclosure. As shown in the figure, rotatable system 200 includes system 100 and a rotation component 202.

Rotation component 202 may be any device or system that is able to rotate system 100 about an axis. In this example embodiment, rotation component 202 is operable to rotate system 100 about the Z axis.

In operation, in FIG. 2A, while system 100 is disposed at the first position, dielectric platform 102 is disposed such that SQUID array 104 is disposed in a Z-X plane and is able to detect an RF signal in an Z-X plane. Further, dielectric platform 102 is disposed such that SQUID array 106 is disposed in a Z-Y plane and is able to detect an RF signal in a Z-Y plane. In this example, dielectric platform 102 is shaped such that two SQUID arrays are disposed at orthogonal angles. Dielectric platform 102 would be equivalent to a section of two adjacent sides of a cube. This will be described in greater detail with reference to FIGS. 3A-B.

Figure 3B:
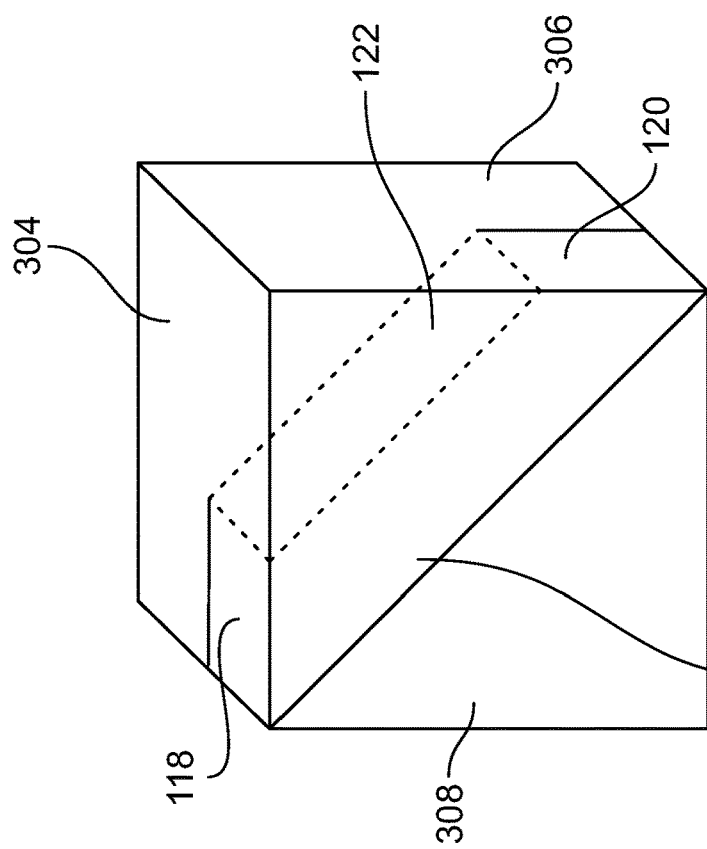
FIG. 3B illustrates an oblique view of the dielectric platform relative to a cube, in accordance with aspects of the present invention.
Figure 3A:
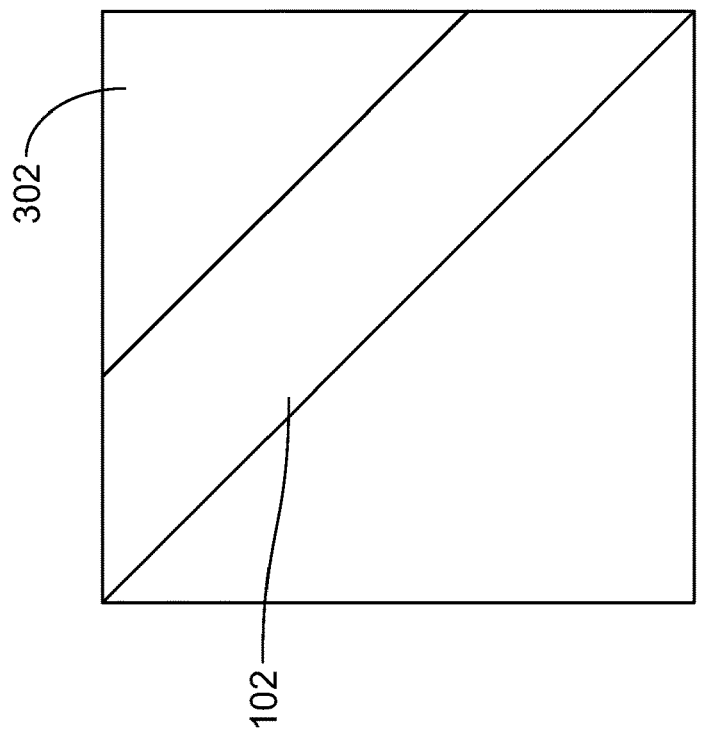
FIG. 3A illustrates a side view of a dielectric platform relative to a cube, in accordance with aspects of the present invention.

FIG. 3A illustrates a side view of dielectric platform 102 relative to a cube 302, in accordance with aspects of the present disclosure. FIG. 3B illustrates an oblique view of dielectric platform 102 relative to a cube, in accordance with aspects of the present disclosure. As shown in the FIG. 3B, cube 302 includes a face 304, a face 306 and a face 308. The disposition of face 304 relative to face 306 illustrates the angular relationship between rectangular planar surface 118 and rectangular planar surface 120.

Returning to FIG. 2A, in this example, let SQUID array 104 detect the RF signal to have components within a Z-X plane 206, whereas SQUID array 106 detects the RF signal to have components within a Z-Y plane 204. SQUID array 104 outputs the detected Z-X plane information related to the detected RF signal to processing component 108 via communication line 110. Similarly, SQUID array 106 outputs the detected Z-Y plane information related to the detected RF signal to processing component 108 via communication line 112.

With the provided Z-Y plane information and the provided Z-X plane information of the detected RF signal, processing component 108 is able to determine an angle, Θ, between detected Z-X plane 206 and detected Z-Y plane 204 of the detected RF signal. Further, processing component is operable to determine the RF signal plane 208, which bisects angle Θ, in which the RF signal is transmitted.

With the X and Y components of the incoming RF signal being detected by SQUID array 104 and SQUID array 106, processing component 108 may calculate RF signal plane 208. However, in the absence of a differential in measurements in the Z-axis, the actual Poynting of the incoming RF signal cannot be determined. Nevertheless, the bearing of the incoming RF signal may be determined with another set of detections, as will be described in greater detail with reference to FIG. 2B.

Figure 2B:
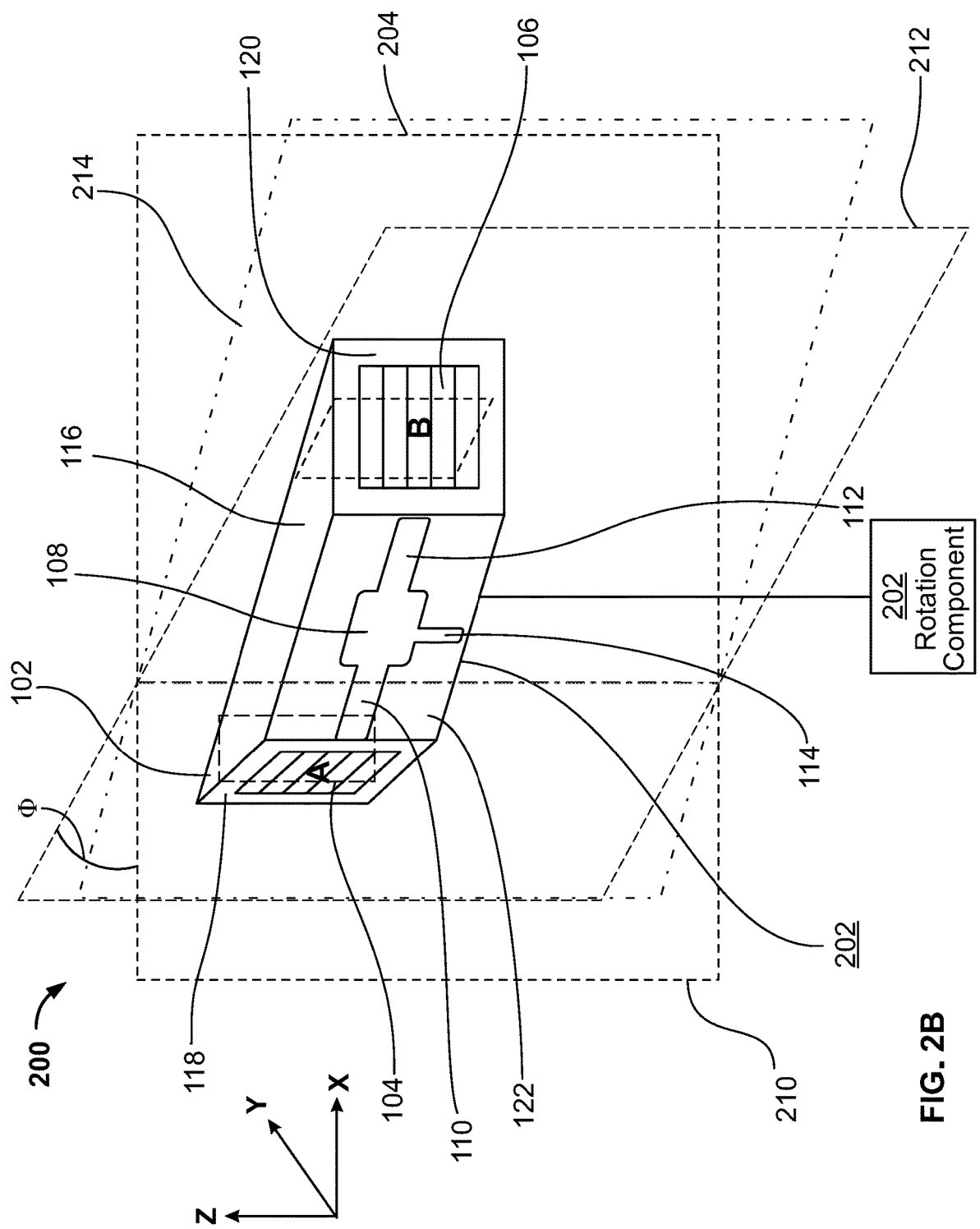
FIG. 2B illustrates the rotatable system of FIG. 2A, disposed in a second position.

FIG. 2B illustrates rotatable system 200, with system 100 being disposed in a second position corresponding to FIG. 1B.

In operation, in FIG. 2B, while system 100 is disposed at the second position, dielectric platform 102 is disposed such that SQUID array 104 is disposed in a Z-Y plane and is able to detect an RF signal in a Z-Y plane. Further, dielectric platform 102 is disposed such that SQUID array 106 is disposed in a Z-X plane and is able to detect an RF signal in a Z-X plane.

In this example, let SQUID array 104 detect the RF signal to have components within a Z-Y plane 210, whereas SQUID array 106 detects the RF signal to have components within a Z-X plane 212. SQUID array 104 outputs the detected Z-Y plane information related to the detected RF signal to processing component 108 via communication line 110. Similarly, SQUID array 106 outputs the detected Z-X plane information related to the detected RF signal to processing component 108 via communication line 112.

With the provided Z-Y plane information and the provided Z-X plane information of the detected RF signal, processing component 108 is able to determine an angle, Φ, between detected Z-Y plane 210 and detected Z-X plane 212 of the detected RF signal. Further, processing component 108 is operable to determine the RF signal plane 214, which bisects angle Φ, in which the RF signal is transmitted. It should be noted that plane 214 and plane 208 of FIG. 2A are the same plane, as they both represent the plane in which the RF signal is transmitted. However, with the additional Z-Y plane information provided by SQUID array 104, processing component 108 is operable to determine a bearing in which the RF signal is transmitted.

Processing component 108 may use any known algorithm to determine Θ, plane 208, Φ, plane 214 and the bearing of the RF signal, a non-limiting example of which may be found in Berggren et al., "Simulated bi-SQUID Arrays Performing Direction Finding," Technical Report 2089, SPAWAR Systems Center PACIFIC, September 2015, the entire disclosure of which is incorporated herein by reference. Processing component 108 may output the bearing information to an external display (not shown) or memory (not shown) by way of output line 114.

In the above discussed embodiment, system 100 is rotated 90° to the second position as shown in FIG. 2B. It should be noted that this is a non-limiting example. In other embodiments, system 100 may be rotated by another amount, so long as at least one of SQUID array 104 and SQUID array 106 detects the RF signal from a plane that is different from the planes that the RF signal are detected by SQUID array 104 and SQUID array 106 in the first position shown in FIG. 2A.

The embodiment discussed above with reference to FIGS. 1A-2B illustrates that a rotation could be used to determine the null and direction of greatest magnitude (a 90° rotation is shown). One of ordinary skill in the art may use a two-dimensional (2D) direction finding algorithm in combination with a three-dimensional (3D) algorithm to perform the direction finding.

SQUID arrays have the potential to increase sensitivities by more than two orders of magnitude over current technology using discrete SQUID sensors. In accordance with the present disclosure, direction finding will be able to be performed over the HF-UHF band with a much smaller device or network of devices, enabling use on smaller platforms such as unmanned aerial vehicles (UAVs). In accordance with another aspect of the present disclosure, the use of a rotational method with two arrays separated by more than 2-3 times the chip dimensions has the advantage of increasing the baseline of the measurement resulting in a corresponding improvement of the ability to measure the phase differential of shorter wavelengths. It should be noted that the use of two SQUID arrays reduces the cost of the device.

In some embodiments, the arrays could be Josephson junction arrays, SQUID arrays and/or bi-SQUID arrays. The rotation may or may not be needed depending on desired accuracy and direction finding algorithms used. A nonlinear resonant structure could be used between arrays on a side to increase the accuracy of the small baseline. The rotational method may be adapted for use as a failure mitigation procedure for a co-located SQUID array direction finding device based on three SQUID arrays arranged closely on the corners of a cube. Optical functionality and or circuitry could be integrated into the thermal base with the use of sapphire, LiNbO3, etc.

An alternate device and method wherein both the azimuth and elevation of an incoming RF signal, for example in the very high frequency (VHF) to super high frequency (SHF) bands (an absolute determination of the Poynting vector), can be established without the need for electric field sensors. This may be accomplished by combining and adapting existing 2D and 3D algorithms for direction finding in combination with a complex three-dimensional layout of SQUID array RF sensors. This is possible due to the SQUID arrays being so small, enabling a one cubic centimeter (1 $cm^3$) cube to comprise six or more arrays, two or more per side performing a 2D algorithm and one from each side performing a 3D algorithm. Two or more cubes can be utilized to perform 2D algorithms on a longer baseline for an extension of direction finding in the high frequency band, and for performing direction finding on multiple signals of the same frequency.

The RF sensing portion of the system would include one or more cryogenically cooled cubes having two or more arrays on three sides. In a non-limiting example embodiment, the cubes and arrays would have approximate dimensions of (3 cm×3 cm×3 cm) and (1 cm×1 cm), respectively. The arrays on each face will be used in conjunction with known 2D direction finding algorithms and the arrays from all three faces will be used simultaneously to carry out known 3D direction finding algorithms in order to find the azimuth and elevation of an incoming signal without the need for electric field antennas. Arrays from separate cubes can also be used together to perform 2D algorithms so as to improve direction finding calculations and/or for performing direction finding of multiple signals having the same frequency. In an example embodiment, a system includes two cubes with four arrays on three sides. This will be described in greater detail with reference to FIGS. 4-5C.

Figure 4:
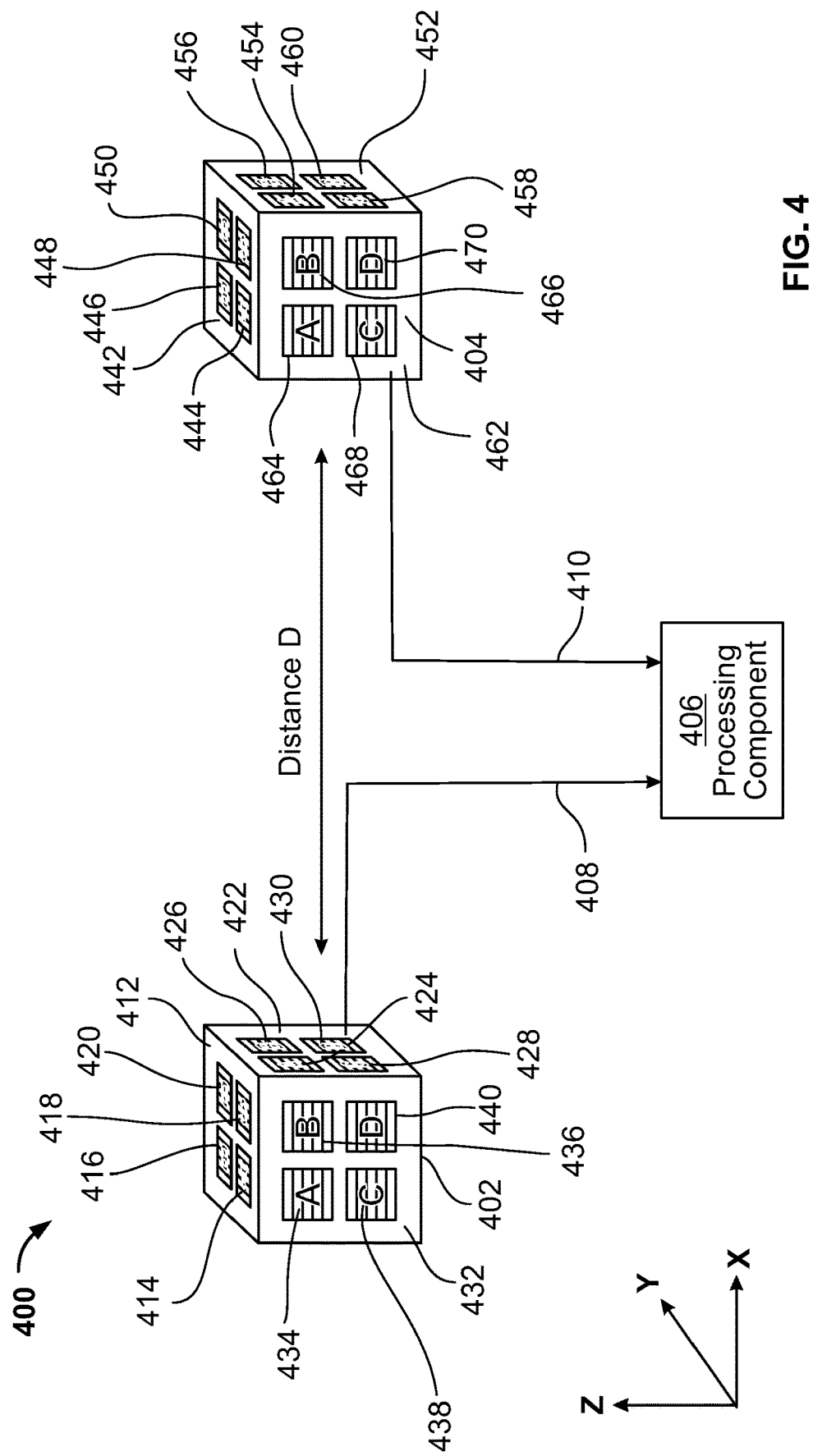
FIG. 4 illustrates another system for detecting a radio frequency signal in accordance with aspects of the present disclosure.

FIG. 4 illustrates another system 400 for detecting a radio frequency signal in accordance with aspects of the present disclosure. As shown in the figure, system 400 includes a dielectric platform 402, a dielectric platform 404, a processing component 406 a communication line 408 and a communication line 410. Dielectric platform 402 includes: a planar surface 412 having a SQUID array 414, a SQUID array 416, a SQUID array 418 and a SQUID array 420; a planar surface 422 having a SQUID array 424, a SQUID array 426, a SQUID array 428 and a SQUID array 430; and a planar surface 432 having a SQUID array 434, a SQUID array 436, a SQUID array 438 and a SQUID array 440. Dielectric platform 404 includes: a planar surface 442 having a SQUID array 444, a SQUID array 446, a SQUID array 448 and a SQUID array 450; a planar surface 452 having a SQUID array 454, a SQUID array 456, a SQUID array 458 and a SQUID array 460; and a planar surface 462 having a SQUID array 464, a SQUID array 466, a SQUID array 468 and a SQUID array 470.

Dielectric platform 402 is disposed such that planar surface 412 is disposed in an X-Y plane (please note the XYZ key in the figure), such that planar surface 422 is disposed in a Z-Y plane and such that planar surface 432 is disposed in a Z-X plane. Dielectric platform 404 is disposed a distance d from dielectric platform 402 and is disposed such that planar surface 442 is disposed in the X-Y plane, such that planar surface 452 is disposed in a Z-Y plane and such that planar surface 462 is disposed in a Z-X plane.

Each of SQUID arrays 414, 416, 418 and 420 on planar surface 412 is respectively operable to detect components of a detected RF signal in an X-Y plane. Each of SQUID arrays 424, 426, 428 and 430 on planar surface 422 is respectively operable to detect components of a detected RF signal in a Z-Y plane. Each of SQUID arrays 434, 436, 438 and 440 on planar surface 432 is respectively operable to detect components of a detected RF signal in a Z-X plane.

Similar to planar surface 412, each of SQUID arrays 444, 446, 448 and 450 on planar surface 442 is respectively operable to detect components of a detected RF signal in an X-Y plane. Further, similar to planar surface 422, each of SQUID arrays 454, 456, 458 and 460 on planar surface 452 is respectively operable to detect components of a detected RF signal in an Z-Y plane. Still further, similar to planar surface 432, each of SQUID arrays 464, 466, 468 and 470 on planar surface 462 is respectively operable to detect components of a detected RF signal in an Z-X plane.

In operation, a set of three SQUID arrays from different planar surfaces may be used to determine the Poynting vector of an RF signal. For example, for dielectric platform 402, SQUID array 414, which would detect the X and Y components of the RF signal on planar surface 412, SQUID array 428, which would detect the Z and Y components of an RF signal on planar surface 422, and SQUID array 440, which would detect the Z and X components of the RF signal on planar surface 432 may be used to determine the Poynting vector of an RF signal.

The output from any SQUID array on dielectric platform 402 is provided to processing component 406 via communication line 408. Similarly, the output from any SQUID array on dielectric platform 404 is provided to processing component 406 via communication line 410. Each of communication line 408 and communication line 410 may take the form of a bus, such that processing component 406 can associate each incoming signal with the respective SQUID array from which each respective incoming signal was provided.

The positional relationships between all the SQUID arrays on dielectric platform 402 are provided as a priori information in processing component 406. Similarly, the positional relationships between all the SQUID arrays on dielectric platform 404 is additionally provided as a priori information in processing component 406. Still further, the distance, d, and directional vector separating dielectric platform 404 from dielectric platform 402 are additionally provided as a priori information in processing component 406.

Processing component 406 is therefore able to determine, using the output signals from various SQUID arrays and the a priori information, the Poynting vector of a detected RF signal using any known method.

Because dielectric platform 402 includes a plurality of SQUID arrays on each of planar surfaces 412, 422 and 432, there are multiple combinations of detectors that may be used to determine the Poynting vector. Because of the multiple options available, any known method of determining the Poynting vector using plural detectors may be used. Some non-limiting examples of using plural SQUID arrays will now be described with reference to FIG. 5A-C.

Figure 5A:
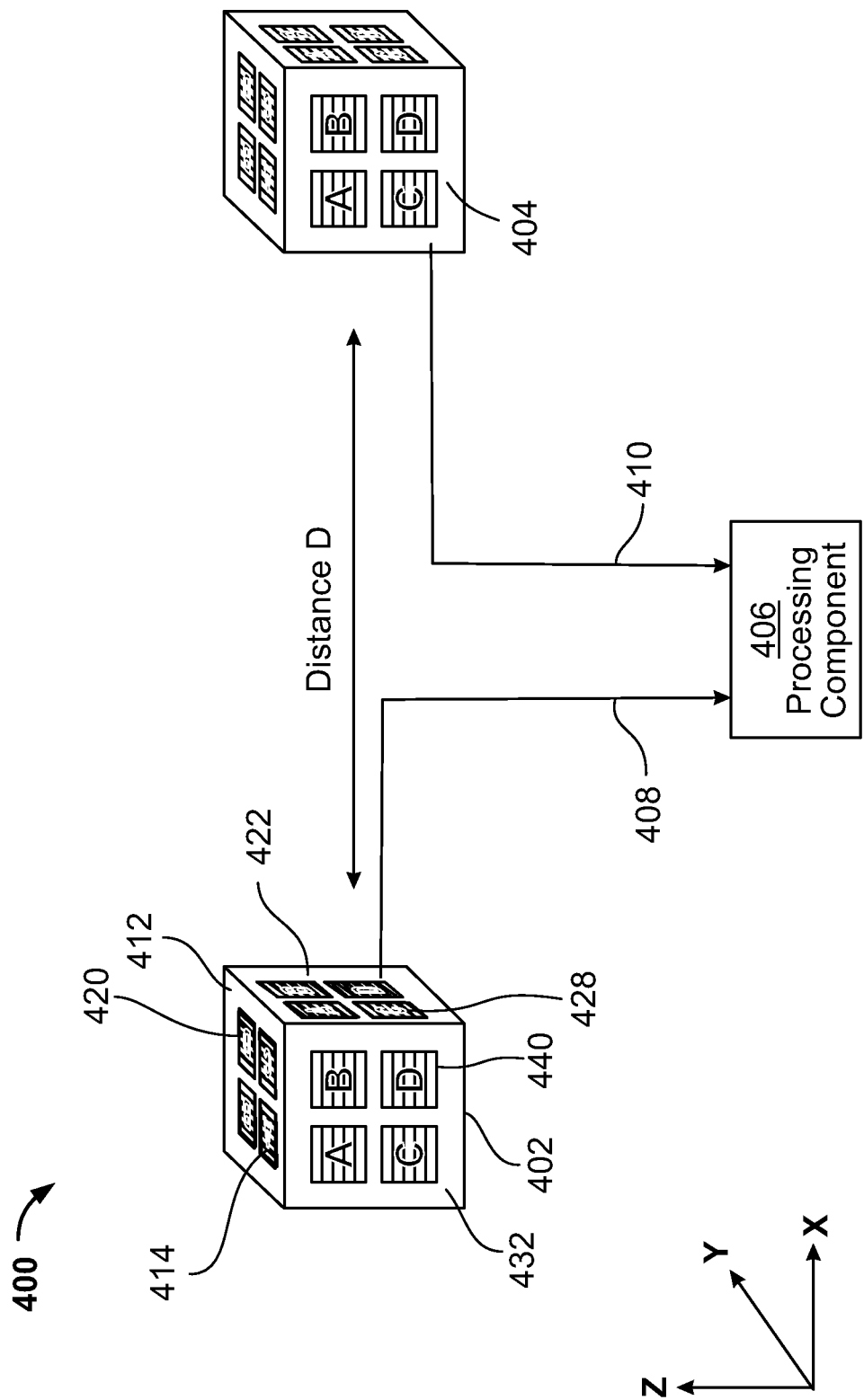
FIG. 5A illustrates an example method of operation of the system of FIG. 4.

FIG. 5A illustrates a non-limiting example method of using system 400, wherein two pairs of SQUID arrays are used to detect the Poynting vector of an RF signal. As shown in the figure, SQUID array 414 on planar surface 412 of dielectric platform 402 is operable to detect an X-Y plane associated with the RF signal and SQUID array 428 on planar surface 422 of dielectric platform 402 able to detect a Z-Y plane associated with the RF signal. Accordingly, the combination of SQUID array 414 on planar surface 412 of dielectric platform 402 and SQUID array 428 on planar surface 422 of dielectric platform 402 is able to detect the X and Z components associated with the RF signal in a manner similar to that discussed above with reference to FIG. 2A.

Similarly, SQUID array 420 on planar surface 412 of dielectric platform 402 is operable to detect an X-Y plane associated with the RF signal and SQUID array 440 on planar surface 432 of dielectric platform 402 able to detect a Z-X plane associated with the RF signal. Accordingly, the combination of SQUID array 420 on planar surface 412 of dielectric platform 402 and SQUID array 440 on planar surface 432 of dielectric platform 402 is able to detect the Y and Z components associated with the RF signal in a manner similar to that discussed above with reference to FIG. 2A.

Therefore, the combination of SQUID array 414 on planar surface 412 of dielectric platform 402 and SQUID array 428 on planar surface 422 of dielectric platform 402 in combination with the combination of SQUID array 420 on planar surface 412 of dielectric platform 402 and SQUID array 440 on planar surface 432 of dielectric platform 402 is able to detect the X, Y and Z components associated with the RF signal.

In the example embodiment of FIG. 5A, two sets of SQUID arrays from a single dielectric platform are used to determine a Poynting vector of an RF signal, wherein each SQUID array of a single set of SQUID arrays is disposed on a different respective planar surface and wherein at least one SQUID array of the two sets of SQUID arrays is disposed on each of the three planar surfaces of the dielectric platform. However, two sets of SQUID arrays are not required from a single dielectric platform to determine the Poynting vector of an RF signal. This will be described in greater detail with reference to FIG. 5B.

Figure 5B:
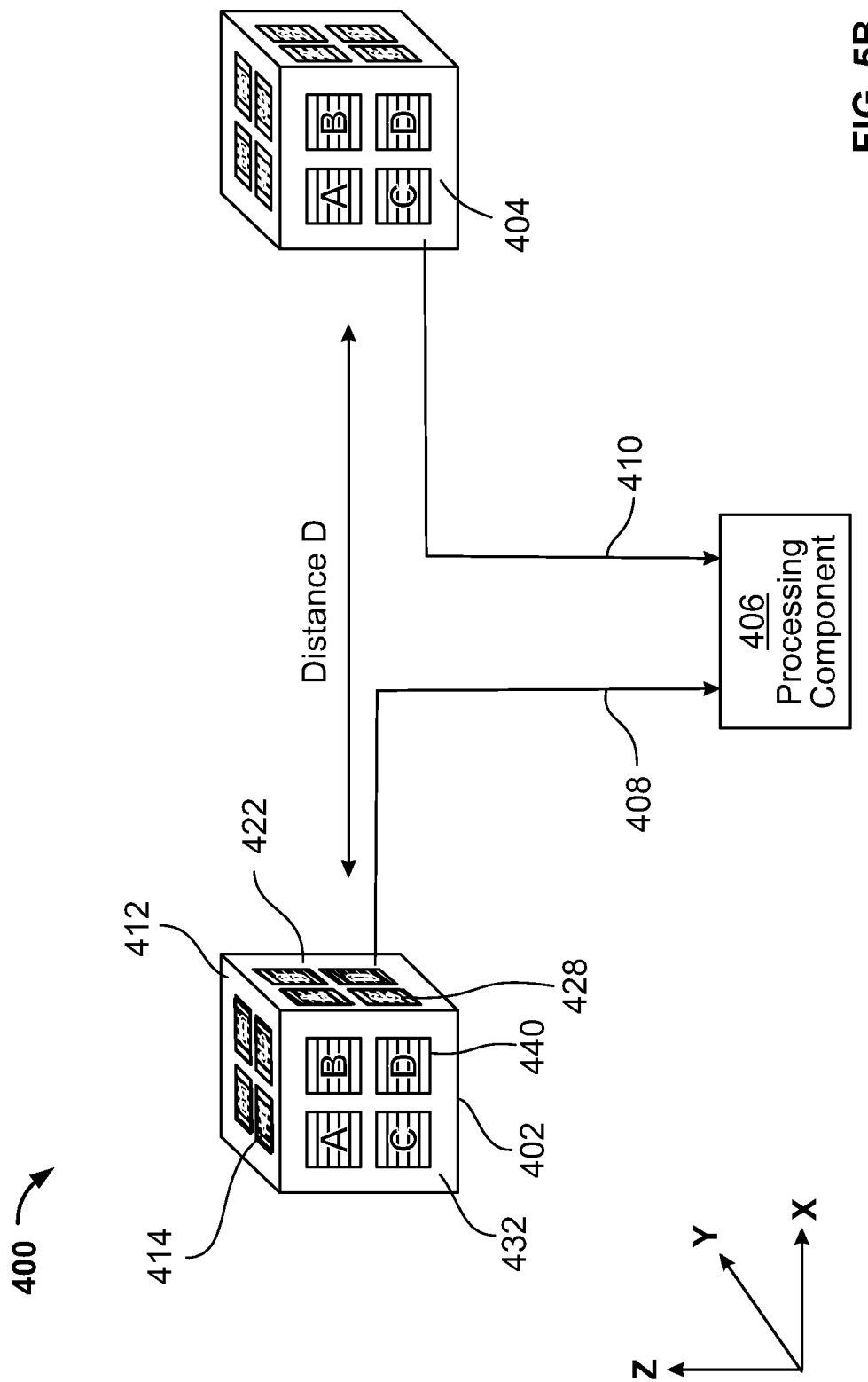
FIG. 5B illustrates another example method of operation of the system of FIG. 4.

FIG. 5B illustrates a non-limiting example method of using system 400, wherein three orthogonal SQUID arrays are used to determine the Poynting vector of an RF signal. As shown in the figure, SQUID array 414 on planar surface 412 of dielectric platform 402 is operable to detect an X-Y plane associated with the RF signal, SQUID array 428 on planar surface 422 of dielectric platform 402 able to detect a Z-Y plane associated with the RF signal, and SQUID array 440 on planar surface 432 of dielectric platform 402 able to detect a Z-X plane associated with the RF signal. Therefore, the combination of SQUID array 414, SQUID array 428 and SQUID array 440 is able to detect the X, Y and Z components associated with the RF signal.

In the example embodiment of FIG. 5B, three SQUID arrays from a single dielectric platform are used to determine a Poynting vector of an RF signal, wherein each SQUID array is disposed on a different respective planar surface. However, the SQUID arrays are not required to be disposed on a single dielectric platform to determine the Poynting vector of an RF signal. This will be described in greater detail with reference to FIG. 5C.

Figure 5C:
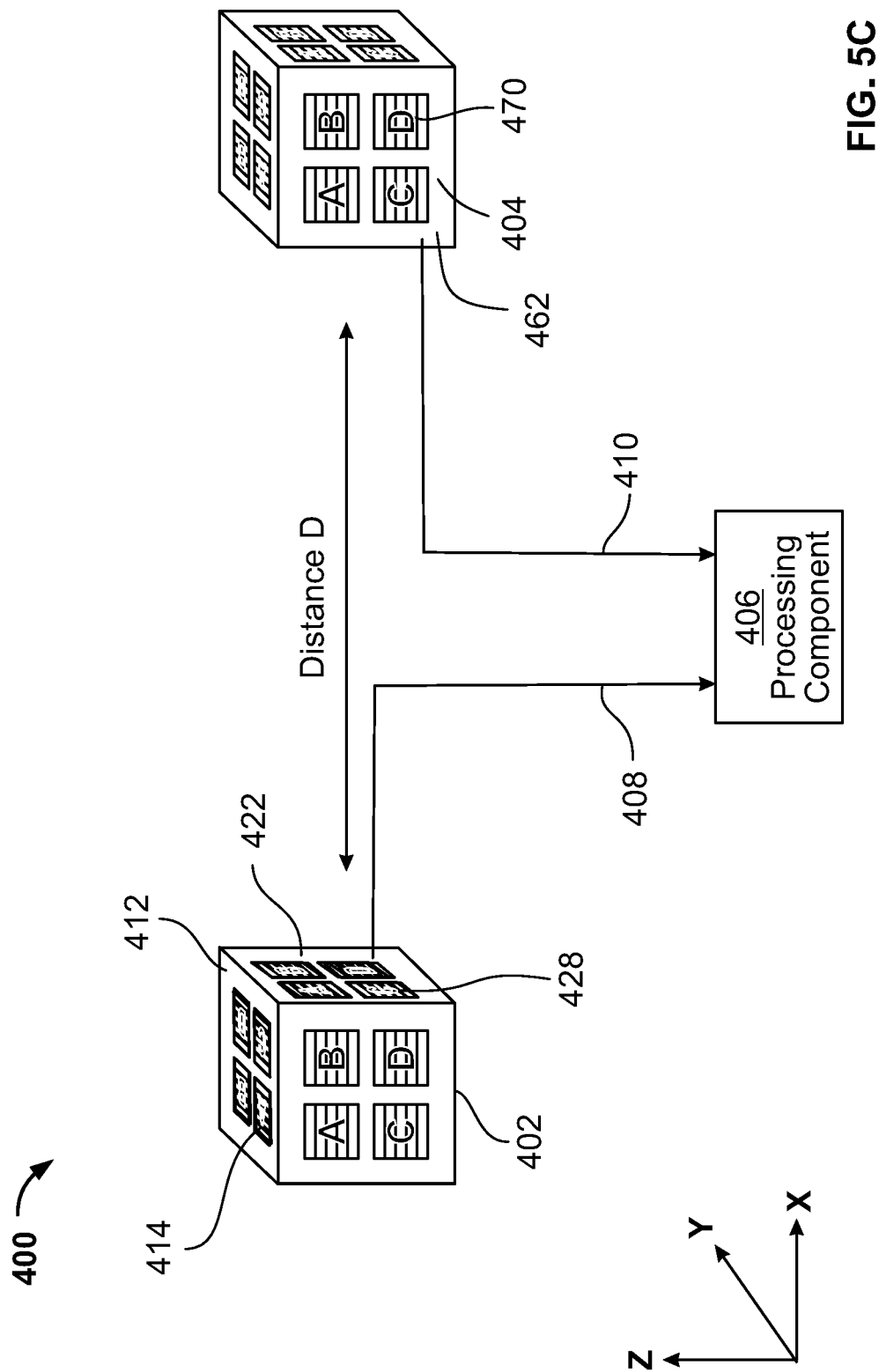
FIG. 5C illustrates another example method of operation of the system of FIG. 4.

FIG. 5C illustrates a non-limiting example method of using system 400, wherein three orthogonal SQUID arrays on two dielectric platforms separated by distance, d, are used to detect the Poynting vector of an RF signal. As shown in the figure, SQUID array 414 on planar surface 412 of dielectric platform 402 is operable to detect an X-Y plane associated with the RF signal and SQUID array 428 on planar surface 422 of dielectric platform 402 is operable to detect Z-Y plane associated with the RF signal in a manner as discussed above with reference to FIG. 5B. Similarly, SQUID array 470 on planar surface 462 of dielectric platform 404 is able to detect a Z-X plane associated with the RF signal. Therefore, the combination of SQUID array 414, SQUID array 428 and SQUID array 470 is additionally able to detect the X, Y and Z components associated with the RF signal.

Multiple or all SQUID arrays on one or both dielectric platforms of system 400 may be used to determine the Poynting vector of a detected RF signal. In some embodiments, the multiple measurements from different sets of SQUID arrays may be used to provide greater accuracy in the determined Poynting vector. Further, the separation distance between dielectric platform 402 and dielectric platform 404 enables additional accuracy in the determined Poynting vector.

SQUID arrays in accordance with aspects of the present disclosure have the potential to increase sensitivities by more than two orders of magnitude over conventional technology using discrete SQUID sensors. Further, direction finding will be able to be performed over the HF-SHF band with a much smaller device or network of devices, enabling use on smaller platforms such as UAVs.

The non-limiting example embodiments discussed above include a dielectric platform having a plurality of SQUID devices. However, it should be noted that other embodiments in accordance with aspects of the present disclosure include RF sensing arrays that include Josephson junction arrays, bi-SQUID arrays, or combinations of SQUID arrays, Josephson junction arrays and bi-SQUID arrays.

The non-limiting example embodiments discussed above with reference to FIGS. 4-5C include a cubic dielectric platform having a plurality of SQUID devices. However, it should be noted that other embodiments in accordance with aspects of the present disclosure include pyramid shaped dielectric platform.

Further, in some embodiments, a nonlinear resonant structure may be used between RF sensing arrays on a single side to increase the accuracy of the small baseline.

The foregoing description of various embodiments has been presented for purposes of illustration and description. It is not intended to be exhaustive or to limit the disclosure to the precise forms disclosed, and obviously many modifications and variations are possible in light of the above teaching. The example embodiments, as described above, were chosen and described in order to best explain the principles of the disclosure and its practical application to thereby enable others skilled in the art to best utilize the disclosure in various embodiments and with various modifications as are suited to the particular use contemplated. It is intended that the scope of the disclosure be defined by the claims appended hereto.

We claim:

1. A system for detecting a radio frequency signal, said system comprising:
    a dielectric platform having a first planar surface and a second planar surface that is disposed at an angle relative to said first planar surface;
    a first array of superconducting quantum interference devices disposed on said first planar surface, said first array being operable to output a first detection signal based on the radio frequency signal;
    a second array of superconducting quantum interference devices disposed on said second planar surface, said second array being operable to output a second detection signal based on the radio frequency signal; and
    a processing component operable to determine a first plane from which the radio frequency signal is transmitting based on the first detection signal and the second detection signal.

2. The system of claim 1, further comprising:
    a rotation component operable to rotate said dielectric platform from a first position to a second position,
    wherein when said dielectric platform is in the first position, said first array is operable to output the first detection signal, said second array is operable to output the second detection signal and processing component is operable to detect the first plane, and
    wherein when said dielectric platform is in the second position, said first array is further operable to output a third detection signal based on the radio frequency signal, said second array is further operable to output a fourth detection signal based on the radio frequency signal and said processing component is further operable to determine a bearing from which the radio frequency signal is transmitting based on the first plane, the third detection signal and the fourth detection signal.

3. The system of claim 2,
    wherein said dielectric platform has a shape of a trapezoidal prism,
    wherein said first planar surface is disposed such that, when said dielectric platform is in the first position, said first planar surface is disposed on a first planar surface plane,
    wherein said second planar surface is disposed such that, when said dielectric platform is in the first position, said second planar surface is disposed on a second planar surface plane, and
    wherein said first planar surface plane is perpendicular to said second planar surface plane.

4. The system of claim 3, when said dielectric platform is in the second position, said first planar surface is disposed on the second planar surface plane.

5. The system of claim 4, wherein said dielectric platform comprises a cryogenically cooled thermally conductive low-dielectric material.

6. The system of claim 5, wherein said dielectric platform comprises a material selected from a group of materials consisting of sapphire, aluminum nitride, LiNbO3 and combinations thereof.

7. The system of claim 1, wherein said dielectric platform comprises a cryogenically cooled thermally conductive low-dielectric material.

8. The system of claim 7, wherein said dielectric platform comprises a material selected from a group of materials consisting of sapphire, aluminum nitride, LiNbO3 and combinations thereof.

9. The system of claim 1, further comprising:
    a third array of superconducting quantum interference devices;
    a fourth array of superconducting quantum interference devices; and
    a second processing component, wherein said dielectric platform further has a third planar surface that is disposed at a second angle relative to said first planar surface and is dispose at a third angle relative to said second planar surface, wherein said third array is disposed on said first planar surface, said third array being operable to output a third detection signal based on the radio frequency signal, wherein said fourth array is disposed on said third planar surface, said fourth array being operable to output a fourth detection signal based on the radio frequency signal, and wherein said second processing component is operable to detect a second plane from which the radio frequency signal is transmitting based on the third detection signal and the fourth detection signal.

10. The system of claim 9, wherein said dielectric platform comprises a cryogenically cooled thermally conductive low-dielectric material.

11. The system of claim 10, wherein said dielectric platform comprises a material selected from a group of materials consisting of sapphire, aluminum nitride, LiNbO3 and combinations thereof.

12. A system for detecting a radio frequency signal, said system comprising:
a first dielectric platform having a first planar surface, a second planar surface that is disposed at an angle relative to said first planar surface and third planar surface that is disposed at a second angle relative to said first planar surface and is dispose at a third angle relative to said second planar surface;
a first array of superconducting quantum interference devices disposed on said first planar surface, said first array being operable to output a first detection signal based on the radio frequency signal;
a second array of superconducting quantum interference devices disposed on said second planar surface, said second array being operable to output a second detection signal based on the radio frequency signal;
a third array of superconducting quantum interference devices disposed on said first planar surface, said third array being operable to output a third detection signal based on the radio frequency signal;
a fourth array of superconducting quantum interference devices disposed on said third planar surface, said fourth array being operable to output a fourth detection signal based on the radio frequency signal;
a second dielectric platform separated from said first dielectric platform by a distance and having a fourth planar surface, a fifth planar surface that is disposed at a fourth angle relative to said fourth planar surface and sixth planar surface that is disposed at a fifth angle relative to said fourth planar surface and is dispose at a sixth angle relative to said fifth planar surface;
a fifth array of superconducting quantum interference devices disposed on said fourth planar surface, said fifth array being operable to output a fifth detection signal based on the radio frequency signal;
a sixth array of superconducting quantum interference devices disposed on said fifth planar surface, said sixth array being operable to output a sixth detection signal based on the radio frequency signal;
a seventh array of superconducting quantum interference devices disposed on said fourth planar surface, said seventh array being operable to output a seventh detection signal based on the radio frequency signal;
an eighth array of superconducting quantum interference devices disposed on said sixth planar surface, said eighth array being operable to output an eighth detection signal based on the radio frequency signal; and
a processing component operable to detect a vector from which the radio frequency signal is transmitting based on the first detection signal, the second detection signal, the third detection signal, the fourth detection signal, the fifth detection signal, the sixth detection signal, the seventh detection signal and the eighth detection signal.

13. The system of claim 12, wherein said first dielectric platform comprises a cryogenically cooled thermally conductive low-dielectric material.

14. The system of claim 13, wherein said first dielectric platform comprises a material selected from a group of materials consisting of sapphire, aluminum nitride, LiNbO3 and combinations thereof.

15. A method for detecting a radio frequency signal, said method comprising:
generating, via a first array of superconducting quantum interference devices disposed on a first planar surface of a dielectric platform having the first planar surface and a second planar surface that is disposed at an angle relative to the first planar surface, a first detection signal based on the radio frequency signal;
generating, via a second array of superconducting quantum interference devices disposed on the second planar surface, a second detection signal based on the radio frequency signal; and
determining, via a processing component, a first plane from which the radio frequency signal is transmitting based on the first detection signal and the second detection signal.

16. The method of claim 15, further comprising:
rotating, via a rotation component, the dielectric platform from a first position to a second position;
generating, via the first array of superconducting quantum interference devices, a third detection signal based on the radio frequency signal;
generating, via the second array of superconducting quantum interference devices, a fourth detection signal based on the radio frequency signal; and
determining, via the processing component, a bearing from which the radio frequency signal is transmitting based on the first detection signal, the second detection signal, the third detection signal and the fourth detection signal.

17. The method of claim 16,
wherein the dielectric platform has a shape of a trapezoidal prism,
wherein the first planar surface is disposed such that, when the dielectric platform is in the first position, the first planar surface is disposed on a first planar surface plane,
wherein the second planar surface is disposed such that, when the dielectric platform is in the first position, the second planar surface is disposed on a second planar surface plane, and
wherein the first planar surface plane is perpendicular to the second planar surface plane.

18. The method of claim 17, when the dielectric platform is in the second position, the first planar surface is disposed on the second planar surface plane.

19. The method of claim 18, wherein the dielectric platform comprises a cryogenically cooled thermally conductive low-dielectric material.

20. The method of claim 19, wherein the dielectric platform comprises a material selected from a group of materials consisting of sapphire, aluminum nitride, LiNbO3 and combinations thereof.

* * * * *